(12) United States Patent
Chiu et al.

(10) Patent No.: US 9,275,971 B2
(45) Date of Patent: Mar. 1, 2016

(54) BRIDGE INTERCONNECT WITH AIR GAP IN PACKAGE ASSEMBLY

(71) Applicant: Intel Corporation, Santa Clara, CA (US)

(72) Inventors: Chia-Pin Chiu, Tempe, AZ (US); Zhiguo Qian, Chandler, AZ (US); Mathew J. Manusharow, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/495,396

(22) Filed: Sep. 24, 2014

(65) Prior Publication Data
US 2015/0011050 A1 Jan. 8, 2015

Related U.S. Application Data

(62) Division of application No. 13/610,780, filed on Sep. 11, 2012, now Pat. No. 8,872,349.

(51) Int. Cl.
*H01L 21/28* (2006.01)
*H01L 21/76* (2006.01)
(Continued)

(52) U.S. Cl.
CPC .......... *H01L 24/81* (2013.01); *H01L 21/02164* (2013.01); *H01L 21/30604* (2013.01); *H01L 21/768* (2013.01); *H01L 21/76802* (2013.01); *H01L 21/76877* (2013.01); *H01L 23/5381* (2013.01); *H01L 23/5382* (2013.01); *H01L 23/5386* (2013.01); *H01L 23/5389* (2013.01); *H01L 24/16* (2013.01); *H01L 2224/16225* (2013.01); *H01L 2224/16227* (2013.01); *H01L 2224/81815* (2013.01);
(Continued)

(58) Field of Classification Search
CPC ............ H01L 21/768; H01L 21/76802; H01L 21/02164
USPC .................... 438/619, 319, 411; 257/E21.573
See application file for complete search history.

(56) References Cited

U.S. PATENT DOCUMENTS 5,239,448 A 8/1993 Perkins et al.
6,392,296 B1 5/2002 Ahn et al.
(Continued)

OTHER PUBLICATIONS

Office Action issued in corresponding U.S. Appl. No. 13/610,780, filed Sep. 11, 2012, mailed Apr. 2, 2014, 10 pages.
(Continued)

*Primary Examiner* — Nitin Parekh
(74) *Attorney, Agent, or Firm* — Schwabe, Williamson & Wyatt, P.C.

(57) ABSTRACT

Embodiments of the present disclosure are directed towards techniques and configurations for a bridge interconnect assembly that can be embedded in a package assembly. In one embodiment, a package assembly includes a package substrate configured to route electrical signals between a first die and a second die and a bridge embedded in the package substrate and configured to route the electrical signals between the first die and the second die, the bridge including a bridge substrate, one or more through-hole vias (THVs) formed through the bridge substrate, and one or more traces disposed on a surface of the bridge substrate to route the electrical signals between the first die and the second die. Routing features including traces and a ground plane of the bridge interconnect assembly may be separated by an air gap. Other embodiments may be described and/or claimed.

21 Claims, 7 Drawing Sheets

(51) Int. Cl.
*H01L 23/00* (2006.01)
*H01L 23/538* (2006.01)
*H01L 21/02* (2006.01)
*H01L 21/306* (2006.01)
*H01L 21/768* (2006.01)

(52) U.S. Cl.
CPC ............... *H01L 2924/014* (2013.01); *H01L 2924/01029* (2013.01); *H01L 2924/10253* (2013.01); *H01L 2924/1433* (2013.01); *H01L 2924/15311* (2013.01)

(56) References Cited

U.S. PATENT DOCUMENTS

| | | | |
|---|---|---|---|
| 6,413,852 B1 * | 7/2002 | Grill et al. .................... 438/619 |
| 6,495,445 B2 * | 12/2002 | Clevenger et al. ............ 438/619 |
| 6,815,329 B2 * | 11/2004 | Babich ............... H01L 21/7681 257/E21.579 |
| 6,943,442 B2 | 9/2005 | Sunohara et al. |
| 7,094,669 B2 * | 8/2006 | Bu et al. ........................ 438/462 |
| 7,098,542 B1 | 8/2006 | Hoang et al. |
| 7,285,474 B2 * | 10/2007 | Anderson ......... H01L 21/76802 257/E21.579 |
| 7,589,425 B2 * | 9/2009 | Daamen ............ H01L 21/76813 257/774 |
| 8,064,224 B2 | 11/2011 | Mahajan et al. |
| 8,198,174 B2 * | 6/2012 | Hsu .................. H01L 21/76898 257/E21.585 |
| 8,227,904 B2 | 7/2012 | Braunisch et al. |
| 8,872,349 B2 | 10/2014 | Chiu et al. |
| 2002/0127844 A1 * | 9/2002 | Grill et al. ..................... 438/622 |
| 2006/0057835 A1 * | 3/2006 | Anderson et al. ............. 438/619 |
| 2006/0226527 A1 | 10/2006 | Hatano et al. |
| 2007/0259516 A1 * | 11/2007 | Jahnes et al. .................. 438/618 |
| 2013/0049888 A1 * | 2/2013 | Ruby ............................ 333/187 |

OTHER PUBLICATIONS

U.S. Appl. No. 13/630,297, filed Sep. 28, 2012.
U.S. Appl. No. 13/610,663, filed Sep. 11, 2012.
Sunohara et al., "Silicon Interposer with TSVs (Through Silicon Vias) and Fine Multilayer Wiring," IEEE, 2008 in Proc. IEEE Electronic Components and Technology Conference (ECTC), Lake Buena Vista, FL, May 27-30, 2008, pp. 847-852.
Kumagai et al., "A Silicon Interposer BGA Package with Cu-Filled TSV and Multi-Layer Cu-Plating Interconnect," IEEE, 2008 in Proc. IEEE Electronic Components and Technology Conference (ECTC), Lake Buena Vista, FL, May 27-30, 2008, pp. 571-576.

* cited by examiner

BRIDGE INTERCONNECT WITH AIR GAP IN PACKAGE ASSEMBLY

CROSS REFERENCE TO RELATED APPLICATIONS

The present application is a Divisional of U.S. patent application Ser. No. 13/610,780, filed Sep. 11, 2012, entitled "BRIDGE INTERCONNECT WITH AIR GAP IN PACKAGE ASSEMBLY," which is currently pending. The entire content and disclosure of U.S. patent application Ser. No. 13/610,780 is hereby incorporated by reference in its entirety.

FIELD

Embodiments of the present disclosure generally relate to the field of integrated circuits, and more particularly, to techniques and configurations for a bridge interconnect assembly that can be embedded in a package assembly.

BACKGROUND

Integrated circuit (IC) product architecture has evolved to incorporate a number of heterogeneous functions such as central processing unit (CPU) logic, graphics functions, cache memory and other system functions to create integrated system-on-chip (SOC) designs, which may lower product design complexity and number of components for each product. Previously, products may have required that an end customer design a system board using separate packages for the different functions, which may increase a system board area, power loss, and, thus, cost of an integrated solution.

Emerging multichip package substrate solutions may provide chip-to-chip interconnection structures to address the issues above. Electrical performance of current chip-to-chip interconnect solutions may be adversely affected by electrical resistivity of an interconnection substrate that is too low and a dielectric constant of dielectric materials adjacent to electrically conductive features of the interconnection that is too high.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
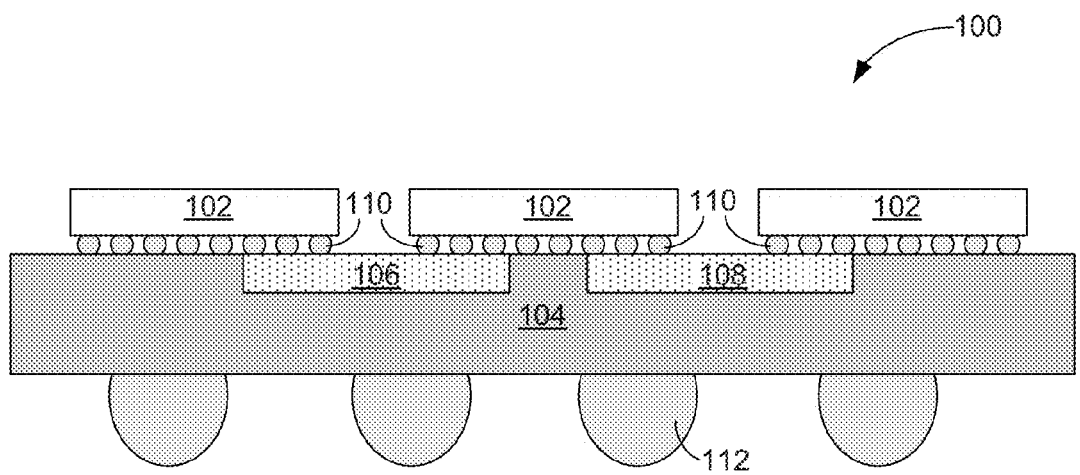
FIG. 1 schematically illustrates a cross-section side view of an example integrated circuit (IC) package assembly including an embedded bridge interconnect assembly, in accordance with some embodiments.

Embodiments of the present disclosure describe techniques and configurations for a bridge interconnect assembly that can be embedded in a package assembly. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly 100 including an embedded bridge interconnect assembly (hereinafter "bridge 106" or "bridge 108"), in accordance with some embodiments. The IC package assembly 100 may include a package substrate 104 having a plurality (e.g., two or more) of dies 102 mounted on the package substrate 104. The dies 102 can be attached to the package substrate 104 according to a variety of suitable configurations including, a flip-chip configuration, as depicted, or other configurations such as wirebonding and the like. In the flip-chip configuration, an active side of the dies 102 is attached to a surface of the package substrate 104 using die interconnect structures 110 such as bumps or pillars, as can be seen. The active side of the dies 102 may have one or more transistor devices formed thereon. Each of the dies 102 may represent a discrete chip. The dies 102 may be, include, or be a part of a processor, memory, or application specific integrated circuit (ASIC) in some embodiments.

The die interconnect structures 110 may be configured to route electrical signals between the dies 102 and the package substrate 104. In some embodiments, the die interconnect structures 110 may be configured to route electrical signals such as, for example, input/output (I/O) signals and/or power or ground signals associated with the operation of the dies 102.

The package substrate 104 may include electrical routing features configured to route electrical signals to or from the dies 102. The electrical routing features may be internal and/or external to the bridge 106 or 108. For example, in some embodiments, the package substrate 104 may include electrical routing features such as pads or traces (not shown) configured to receive the die interconnect structures 110 and route electrical signals to or from the dies 102. Package level interconnects 112 such as, for example, solder balls, may be coupled to a surface of the package substrate 104 to further route the electrical signals to other electrical devices (e.g., motherboard or other chipset). In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments.

In some embodiments, the dies 102 are electrically coupled with a bridge 106 or 108 that is configured to route electrical signals between the dies 102. The bridge 106 or 108 may be a dense interconnect structure that provides a route for electrical signals. The bridge 106 or 108 may include a bridge substrate composed of glass or a semiconductor material (e.g., high resistivity silicon) having electrical routing features formed thereon to provide a chip-to-chip connection between the dies 102. The bridge 106 or 108 may be composed of other suitable materials in other embodiments.

The bridges 106, 108 may be embedded in a cavity of the package substrate 104 in some embodiments. The bridge 106 or 108 may comport with embodiments described in connection with other figures herein. For example, in some embodiments, the bridge 106 or 108 may include an air gap to serve as a dielectric material between electrical routing features of the bridge 106 or 108. In some embodiments, a portion of the dies 102 may overly the embedded bridge 106 or 108, as can be seen.

Although three dies 102 and two bridges 106, 108 are depicted in connection with FIG. 1, other embodiments may include more or fewer dies and bridges connected together in other possible configurations including three-dimensional configurations. For example, another die that is disposed on the package substrate 104 in or out of the page relative to the dies 102 of FIG. 1 may be coupled to the dies 102 using another bridge.

Figure 2:
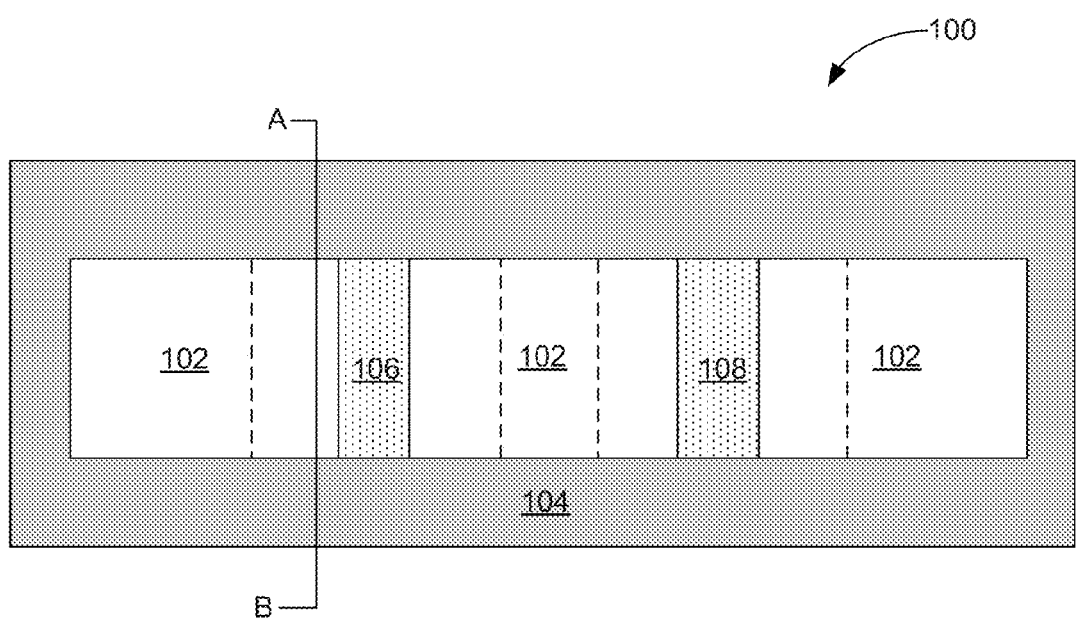
FIG. 2 schematically illustrates a top view of the example integrated circuit (IC) package assembly of FIG. 1, in accordance with some embodiments.

FIG. 2 schematically illustrates a top view of the example integrated circuit (IC) package assembly 100 of FIG. 1, in accordance with some embodiments. A bridge (e.g., bridge 106 or 108) may be disposed between each of the dies 102. In some embodiments, a bridge may be disposed between some dies on the package substrate 104 and not between other dies.

Dashed lines indicate an example boundary of the bridges 106, 108 underlying the dies 102. In some embodiments, the bridges 106, 108 may not be visible from a top view. Intervening materials or layers may be formed on the bridges 106, 108 in some embodiments. Line AB depicts an example cross-section configuration as described in connection with FIGS. 3 and 6.

Figure 3:
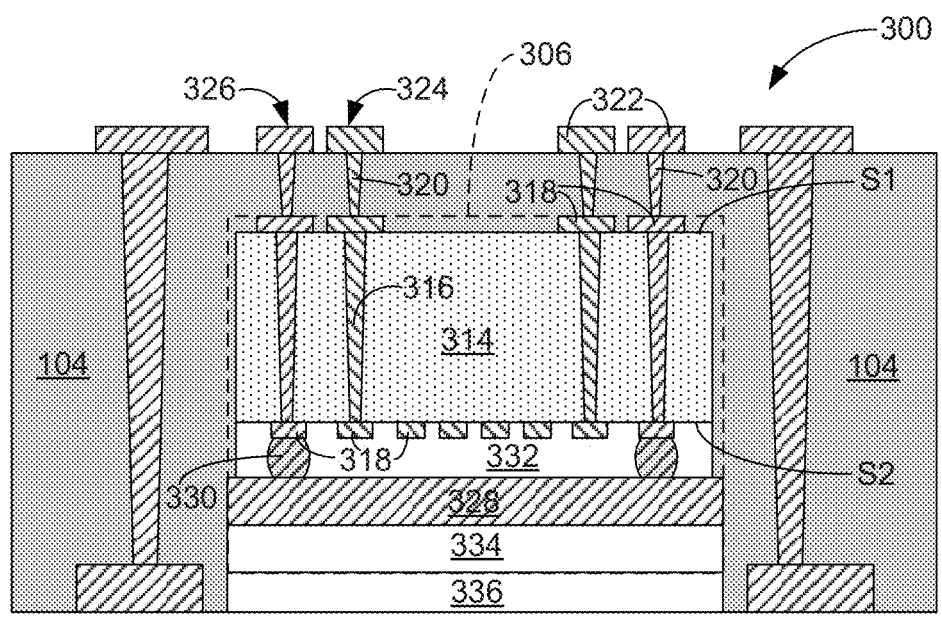
FIG. 3 schematically illustrates a cross-section side view of the example IC package assembly of FIG. 2 showing a configuration of a bridge interconnect assembly, in accordance with some embodiments.

FIG. 3 schematically illustrates a cross-section side view of the example IC package assembly 100 of FIG. 2 showing a configuration 300 of a bridge interconnect assembly (hereinafter "bridge 306"), in accordance with some embodiments. The configuration 300 may schematically represent a cross-section side view of the IC package assembly 100 of FIG. 2 along line AB. The dies 102 are omitted from the view for the sake of clarity. The bridge 306 is demarcated with a dashed line to depict an approximate boundary of the bridge 306 (e.g., components of the bridge 306 prior to embedding in the package substrate 104). The configuration 300 may represent only a portion of the package substrate 104 (e.g., top layers of the package substrate 104).

The bridge 306 includes a bridge substrate 314, which may be composed of a high resistivity/low conductivity material such as, for example, glass or semiconductor material such as silicon. One or more electrical routing features may be formed on and through the bridge substrate 314. In some embodiments, one or more through hole vias (THVs) 316 are formed through the bridge substrate 314, as can be seen, to provide an electrical pathway between opposing surfaces (e.g., surfaces S1 and S2) of the bridge substrate 314. In an embodiment where the bridge substrate 314 is composed of glass, the one or more THVs 316 may be through glass vias (TGVs) and in an embodiment where the bridge substrate 314 is composed of silicon, the one or more THVs 316 may be through silicon vias (TSVs). In embodiments where the bridge substrate 314 is composed of low temperature co-fired ceramic (LTCC), the THVs 316 may be through ceramic vias (TCVs).

Additional electrical routing features such as, for example, pads or traces and the like (referred to generally as "surface routing features 318") may be formed on surfaces (e.g., surfaces S1 and S2) of the bridge substrate 314 to route the electrical signals between dies (e.g., dies 102 of FIG. 1) on the package substrate 104. For example, the surface routing features 318 may be electrically coupled with package routing features formed in the package substrate 104 such as, for example, vias 320, pads 322, or other routing structure such as trenches or traces. The package routing features (e.g., vias 320, pads 322, and the like) may be configured to be electrically coupled with the dies (e.g., dies 102 of FIG. 1). The surface routing features 318 on surface S1 may be electrically coupled with the one or more THVs 316 to route electrical signals sent between the dies through the vias 320 over the THVs 316 to surface routing features 318 formed on surface S2 of the bridge substrate 314.

According to various embodiments, electrically conductive interconnect structures (e.g., one or more THVs 316, surface routing features 318, vias 320, pads 322) of the configuration 300 are patterned with a first hatching (e.g., indicated by 324) to indicate that such marked interconnect structures are configured to route I/O signals and patterned with a second hatching (e.g., indicated by 326) that is perpendicular to the first hatching to indicate that such marked interconnect structures are configured to route power and/or ground signals. In some embodiments, the second hatching (e.g., 326) indicates routing for ground signals. The electrically conductive structures may be composed of any suitable material including metals such as copper.

In some embodiments, the surface routing features 318 (e.g., ground pads) with the second hatching (e.g., 326) may be electrically coupled with a ground plane 328 that is configured to provide a ground signal. The ground plane 328 may be electrically and physically coupled with the surface routing features 318 on the surface S2 of the bridge substrate 314 using an interconnect structure such as, for example, a solder bond 330 (e.g., solder bump) or pillar. The ground plane 328 may be configured to route the ground signal to one or both of the dies (e.g., dies 102 of FIG. 1) through the one or more THVs 316.

According to various embodiments, the bridge 306 may include an air gap 332 disposed between surface S2 of the bridge substrate 314 and the ground plane 328, as can be seen. The air gap 332 may provide air as a dielectric material between surface routing features 318 configured to route I/O signals and the ground plane 328. The air gap 332 may further provide air as a dielectric material between adjacent surface routing features 318 on the surface S2, as can be seen. The air gap 332 may have a lower dielectric constant than other dielectric materials and may increase electrical performance of the bridge 306 by, e.g., reducing a capacitance of the routing features 318. The interconnect structure (e.g., solder bond 330) that is formed to connect the ground plane 328 with the surface routing features 318 may be formed to control a distance of the air gap 332 between the surface S2 of the bridge substrate 314 and the ground plane 328 and, thus, control a distance between surface routing features 318 and the ground plane 328. In some embodiments, a distance of the air gap between the surface S2 and the ground plane 328 may range from 3 microns to 5 microns. The distance may have other values in other embodiments.

In some embodiments, the bridge 306 may further include a strengthening layer 334 coupled with the ground plane 328. The strengthening layer 334 may be composed of any suitable material that lends structural integrity to the ground plane 328 during manufacturing process that forms the air gap 332. The strengthening layer 334 may include, for example, solder, metal (e.g. Cu, Ni, Au formed by electroplating), or silicon (Si) (e.g., wafer).

The bridge 306 may be placed in a cavity formed in the package substrate 104 to provide the embedded bridge 306 as depicted in the configuration 300 of FIG. 3. In some embodiments, a suitable adhesive (e.g., die attach adhesive) may be applied to surfaces of the bridge substrate 314 to couple material of the bridge substrate 314 with material (e.g., epoxy material) of the package substrate 104. A solder reflow or electroplating process may be performed to couple surface routing features 318 of the bridge 306 with package routing structures (e.g., vias 320 and the like). In some embodiments, the bridge 306 may be exposed instead of being fully embedded inside the package substrate 104 as depicted. For example, the vias 320 may not be used in some embodiments and the bridge 306 may be mounted on a surface of the package substrate 104 using any suitable surface mounting technique or partially embedded in the package substrate 104 using techniques described herein for the fully embedded bridge 306.

A finishing layer 336 (e.g., die backside film) may be formed on the strengthening layer 334, as can be seen, to enhance adhesion between the bridge 306 and the package substrate 104 or control the depth by which the bridge 306 is embedded into the package substrate 104. In some embodiments, the finishing layer 336 may be composed of an epoxy material. The finishing layer 336 may include multiple layers or other materials in other embodiments. In embodiments where a strengthening layer 334 is not used, the finishing layer 336 may be formed on the ground plane 328. In some embodiments, a finishing layer 336 may not be used at all (e.g., exposed bridge 306).

Figure 4:
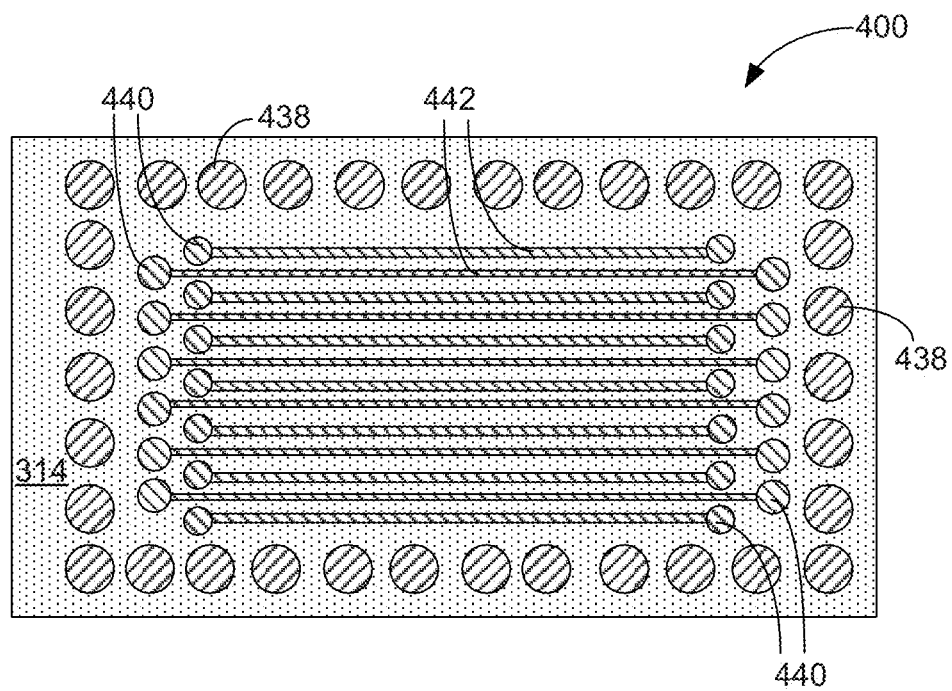
FIG. 4 schematically illustrates a bottom view of an arrangement of routing features on a bridge interconnect assembly, in accordance with some embodiments.

FIG. 4 schematically illustrates a bottom view of an arrangement 400 of routing features (e.g., surface routing features 318 of FIG. 3) on a bridge interconnect assembly (e.g., bridge 306 of FIG. 3), in accordance with some embodiments. The arrangement 400 may represent the surface S2 of the bridge substrate 314 in the configuration 300 of FIG. 3, in some embodiments.

The routing features of the arrangement 400 include ground pads 438, I/O vias 440 and I/O traces 442, configured as can be seen. The ground pads 438 may be configured to form a grounding connection with the ground plane (e.g., ground plane 328 of FIG. 3), structurally support the bridge (e.g., bridge 306 of FIG. 3) and control an air gap (e.g., air gap 332 of FIG. 3) distance. The I/O vias 440 and I/O traces 442 may route I/O signals between the dies (e.g., dies 102 of FIG. 1). The I/O vias 440 and I/O traces 442 are marked with the first hatching (e.g., indicated at 324 of FIG. 3) to indicate routing for I/O signals and the ground pads 438 are marked with the second hatching (e.g., indicated at 326 of FIG. 3) to indicate routing for the ground signal.

The ground pads 438 may be configured to surround the I/O vias 440 and the I/O traces 442, as can be seen. Such arrangement 400 may provide additional shielding effects on I/O traces 442 in addition to the ground plane (e.g., ground plane 328 of FIG. 3), and also provide even mechanical support to the bridge (e.g., bridge 306 of FIG. 3).

Figure 5:
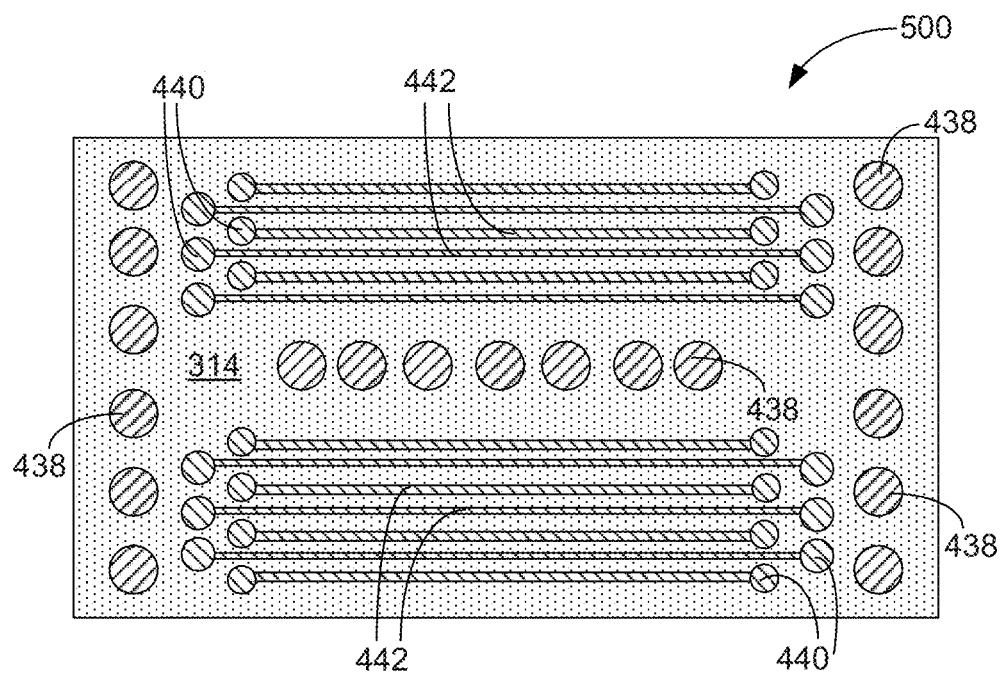
FIG. 5 schematically illustrates a bottom view of another arrangement of routing features on a bridge interconnect assembly, in accordance with some embodiments.

FIG. 5 schematically illustrates a bottom view of another arrangement 500 of routing features (e.g., surface routing features 318 of FIG. 3) on a bridge interconnect assembly (e.g., bridge 306 of FIG. 3), in accordance with some embodiments. The arrangement 500 may represent the surface S2 of the bridge substrate 314 in the configuration 300 of FIG. 3, in some embodiments.

The routing features of the arrangement 500 include ground pads 438, I/O vias 440 and I/O traces 442, configured as can be seen. The ground pads 438 may be configured to form a grounding connection with the ground plane (e.g., ground plane 328 of FIG. 3), structurally support the bridge (e.g., bridge 306 of FIG. 3) and control an air gap (e.g., air gap 332 of FIG. 3) distance. The I/O vias 440 and I/O traces 442 may route I/O signals between the dies (e.g., dies 102 of FIG. 1). The I/O vias 440 and I/O traces 442 are marked with the first hatching (e.g., indicated at 324 of FIG. 3) to indicate routing for I/O signals and the ground pads 438 are marked with the second hatching (e.g., indicated at 326 of FIG. 3) to indicate routing for the ground signal.

The ground pads 438 may be configured in a row or other array along opposite edges of the bridge substrate 314 with a row of ground pads 438 positioned between groups of I/O traces 442 across a center portion of the bridge substrate 314, as can be seen. Such arrangement 500 may provide additional shielding effects to separate the I/O traces 442 (e.g., by separating I/O traces 442 of the of the upper group and the I/O traces 442 of the lower group). The arrangements 400 and 500 may depict an orientation of the bridge substrate 314 where a first die may be coupled with a left side of the arrangement 400 or 500 and a second die may be coupled with a right side of the arrangement 400 or 500. The I/O traces 442 may extend in a lengthwise direction (left and right on the page) towards each of the first die and the second die.

Figure 6:
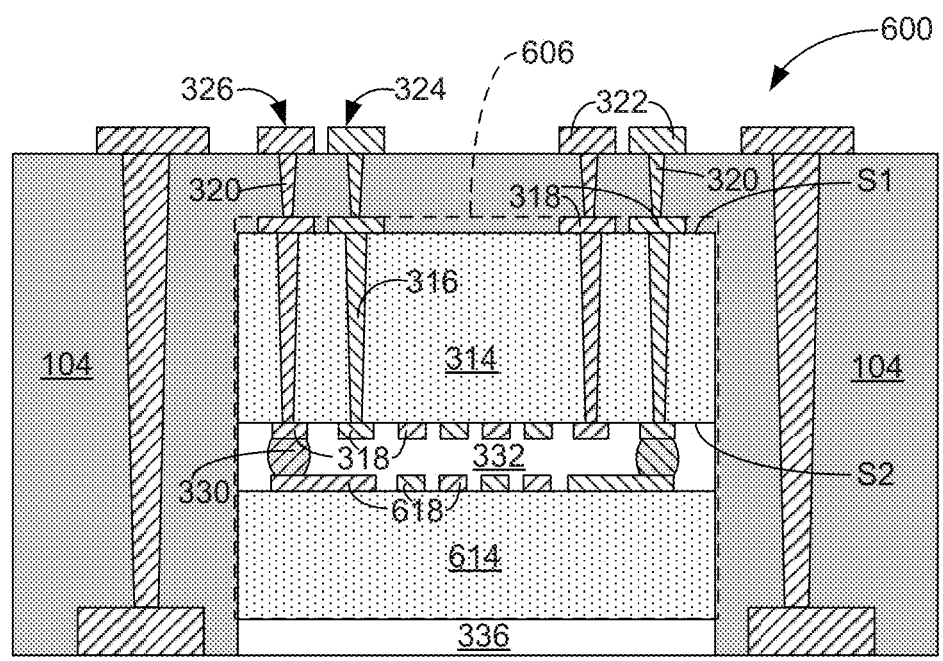
FIG. 6 schematically illustrates a cross-section side view of the example IC package assembly of FIG. 2 showing another configuration of a bridge interconnect assembly, in accordance with some embodiments.

FIG. 6 schematically illustrates a cross-section side view of the example IC package assembly 100 of FIG. 2 showing another configuration of a bridge interconnect assembly (hereinafter "bridge 606"), in accordance with some embodiments. The configuration 600 may schematically represent a cross-section side view of the IC package assembly 100 of FIG. 2 along line AB. The dies 102 are omitted from the view for the sake of clarity. The bridge 606 is demarcated with a dashed line to depict an approximate boundary of the bridge 606 (e.g., components of the bridge 606 prior to embedding in the package substrate 104). The configuration 600 may represent only a portion of the package substrate 104 (e.g., top layers of the package substrate 104).

The bridge 606 may include bridge substrate 314 coupled with bridge substrate 614 using one or more interconnect structures such as, a solder bond 330 (e.g., solder bump or pillar). The solder bond 330 may be formed to control a distance of an air gap 332 between the bridge substrates 314 and 614. The air gap may provide a dielectric material between surface routing features 318 and 618 (e.g., pads, traces and the like) formed on respective adjacent surfaces of the bridge substrate 314 and 614. Using air as a dielectric material between the surface routing features 318 and 618 may enhance electrical performance of the bridge 606 by reducing capacitance between traces. The bridge substrates 314 and 614 may comport with embodiments described in connection with the bridge substrate 314 of FIG. 3 unless otherwise indicated.

Routing features of the I/O signals are patterned with first hatching indicated by 324 and routing features of the power and/or ground signals are patterned with second hatching indicated by 326. In some embodiments, the configuration 600 of FIG. 6 includes a different configuration for routing of I/O signals and routing power and/or ground signals compared with the configuration 300 of FIG. 3. As can be seen, the surface routing features 318 and the surface routing features 618 are configured in a staggered arrangement to provide ground shielding from cross-talk of I/O signals. In some embodiments, each of the surface routing features 318 and 618 that is configured to route I/O signals is positioned adjacent to a surface routing feature 318 and 618 that is configured to route ground signals in at least two dimensions (e.g., up/down and left/right on page of FIG. 6). In some embodiments, surface routing features 318 and 618 on the bridge substrate 314 and 614 are configured to route both I/O signals and ground signals. Such configuration to provide coaxial routing may improve electrical performance of the bridge 606.

In some embodiments, the bridge 606 may be exposed instead of being fully embedded inside the package substrate 104 as depicted. For example, the vias 320 may not be used in some embodiments and the bridge 606 may be mounted on a surface of the package substrate 104 using any suitable surface mounting technique or partially embedded in the package substrate 104 using techniques described herein for the fully embedded bridge 606. In some embodiments, a finishing layer 336 may not be used at all (e.g., exposed bridge 606).

FIGS. 7a-7f schematically illustrate a bridge interconnect assembly ("bridge") subsequent to various fabrication operations, in accordance with some embodiments. The bridge may comport with embodiments described in connection with FIGS. 1-5.

Figure 7A:
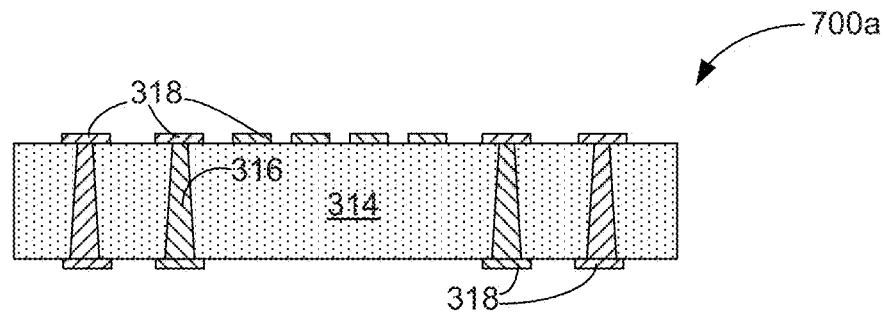
FIGS. 7a-7f schematically illustrate a bridge interconnect assembly subsequent to various fabrication operations, in accordance with some embodiments.

Referring to FIG. 7a, a bridge 700a is depicted subsequent to forming one or more electrical routing features such as, for example, THVs 316 through the bridge substrate 314 and surface routing features 318 on surfaces of the bridge substrate 314. The surface routing features 318 may include pads, traces, and the like.

Figure 7B:
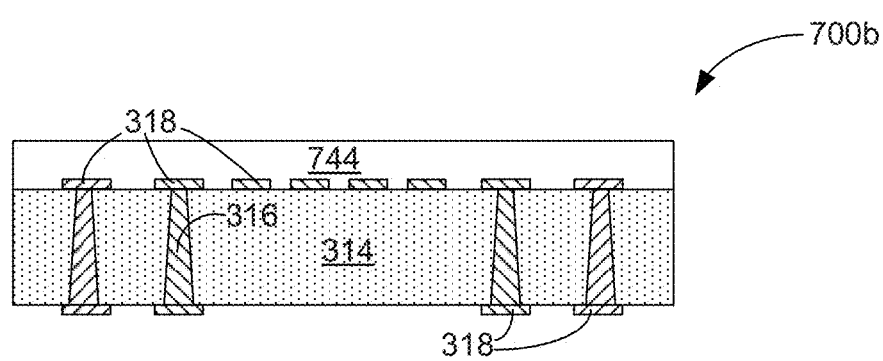

Referring to FIG. 7b, the bridge 700b is depicted subsequent to forming a sacrificial layer 744 on the surface of the bridge substrate 314. The sacrificial layer 744 may include a material that can be selectively removed to provide an air gap (e.g., air gap 332 of FIG. 3). The sacrificial layer 744 can include a variety of materials including, for example, semiconductor materials such as silicon oxide ($SiO_2$) or silicon nitride (SiN) and the like.

Figure 7C:
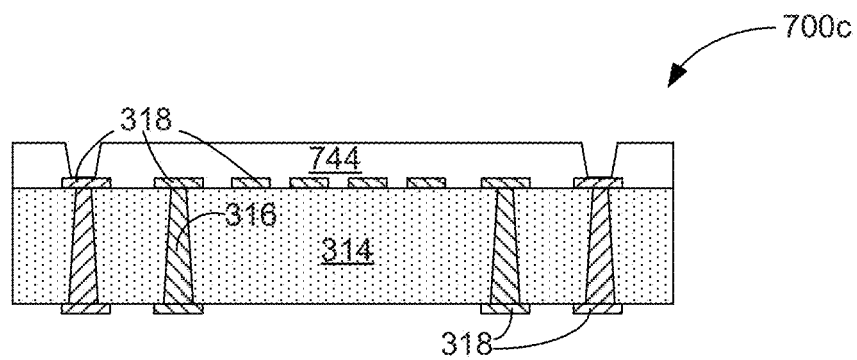

Referring to FIG. 7c, the bridge 700c is depicted subsequent to forming openings in the sacrificial layer 744 to expose one or more of the surface routing features 318. In some embodiments, the openings are formed over surface routing features 318 (e.g., ground pads) that are configured to route a ground signal, as can be seen. The openings may provide an area for formation of electrical connections (e.g., bump interconnects or other deposition of electrically conductive material) on the exposed surface routing features 318.

Figure 7D:
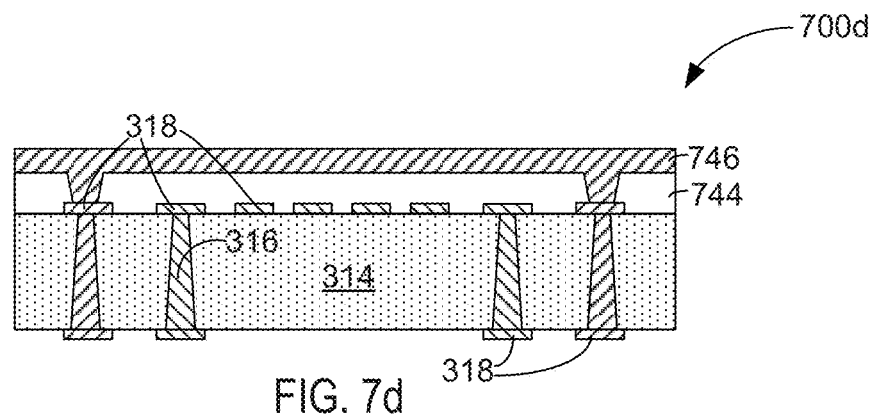

Referring to FIG. 7d, the bridge 700d is depicted subsequent to depositing an electrically conductive material (e.g., solder or metal) into the openings formed in the sacrificial layer 744 and forming an electrically conductive layer 746 on the sacrificial layer 744. In this manner, the electrically conductive layer 746 may be coupled with the surface of the bridge substrate 314 through the sacrificial layer 744 by an electrically conductive material. Interconnect structures may be formed in the openings to couple the electrically conductive layer 746 with the surface routing features 318. The openings may be filled with a first electrically conductive material followed by deposition of the electrically conductive layer 746 using a second electrically conductive material that is different than the first electrically conductive material in some embodiments. In other embodiments, deposition of the electrically conductive layer 746 and filling of the openings may occur in a simultaneous deposition process of a single material. The electrically conductive layer 746 may function as a ground plane (e.g., ground plane 328 of FIG. 3) in some embodiments.

Figure 7E:
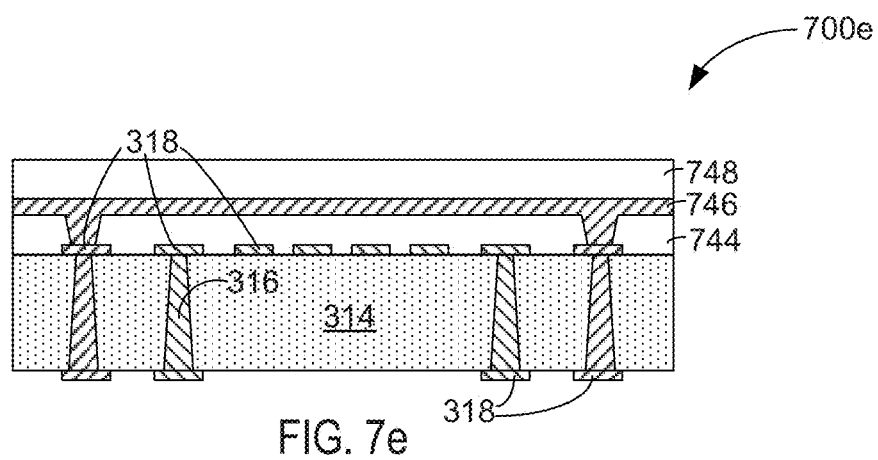

Referring to FIG. 7e, the bridge 700e is depicted subsequent to forming a strengthening layer 748 on the electrically conductive layer 746. The strengthening layer 748 may provide structural rigidity to the electrically conductive layer 746 to avoid collapse or other structural defect of the electrically conductive layer 746 during manufacturing operations such as an operation that removes material of the sacrificial layer

744. The strengthening layer 748 may be composed of a variety of suitable materials including, for example, solder or metal. The strengthening layer 748 may include multiple layers or other materials in other embodiments. In some embodiments, a strengthening layer 748 is composed of an insulating layer (e.g., silicon oxide) with an electroplating metal layer on its top. In another embodiment, the strengthening layer 748 can be another Si wafer.

Figure 7F:
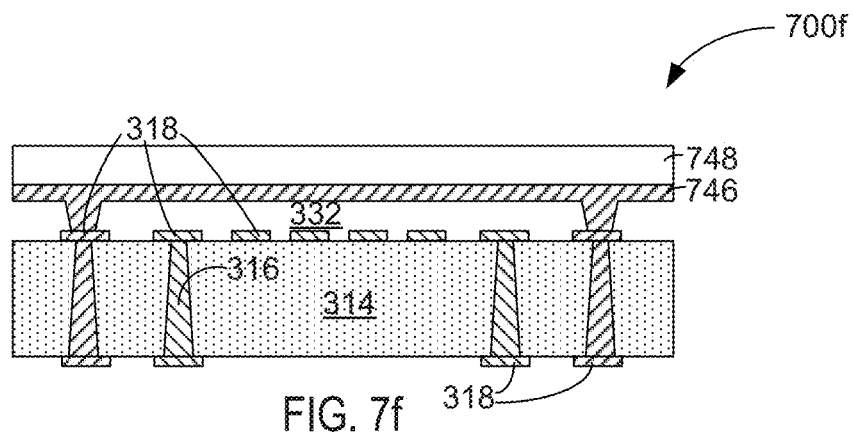

Referring to FIG. 7f, the bridge 700f is depicted subsequent to removing material of the sacrificial layer 744 to provide an air gap 332 between the surface of the bridge substrate 314 and the electrically conductive layer 746. Material of the sacrificial layer 744 may be removed according to a variety of suitable processes including, for example, a selective etch process (e.g., HF acid vapor etch process) that selectively removes the material of the sacrificial layer 744 relative to other exposed materials. The bridge 700f may be embedded into a cavity formed in a package substrate.

Figure 8:
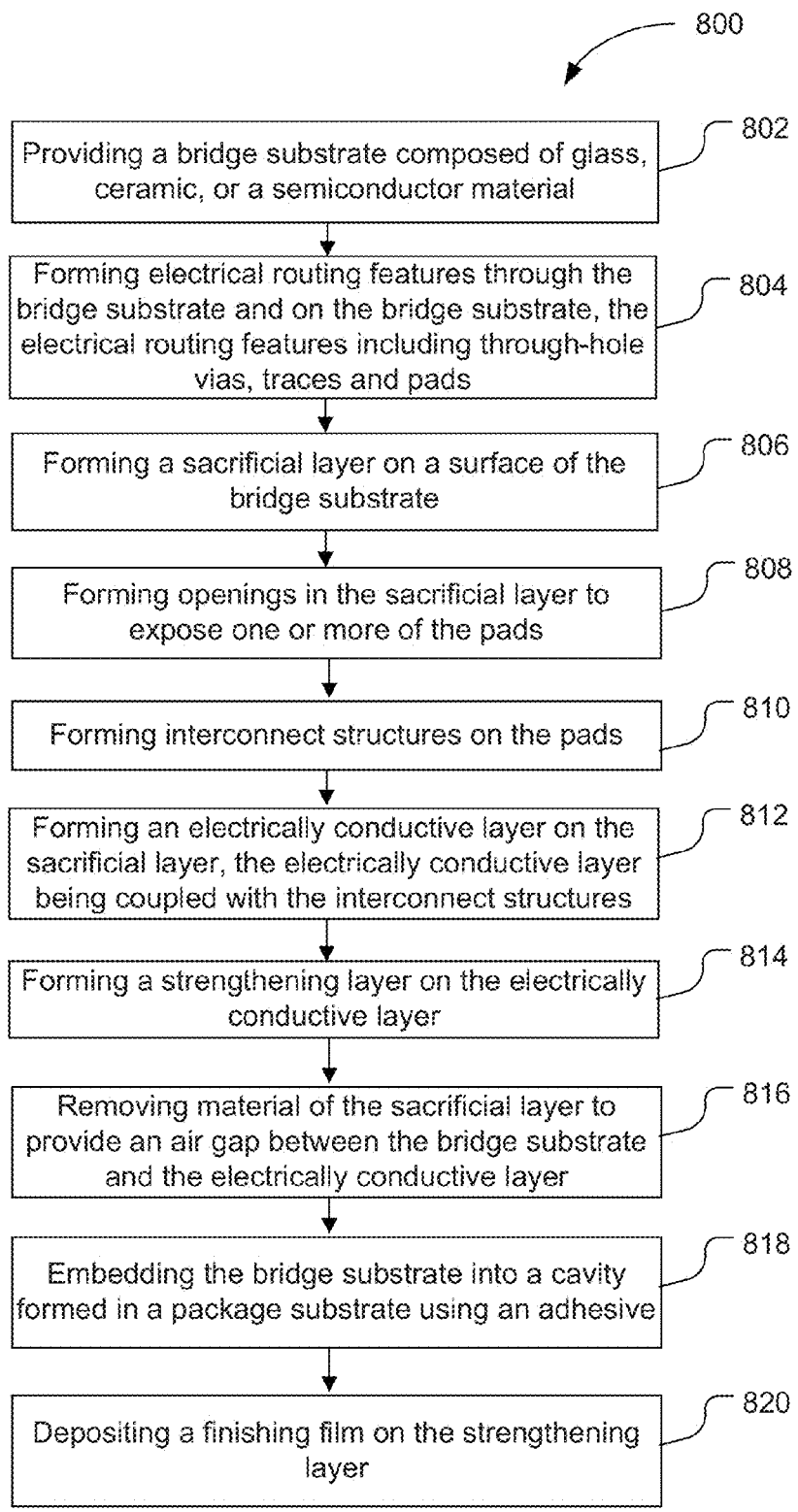
FIG. 8 schematically illustrates a flow diagram for a method of fabricating an IC package assembly, in accordance with some embodiments.

FIG. 8 schematically illustrates a flow diagram for a method 800 of fabricating an IC package assembly (e.g., the IC package assembly 100 of FIG. 1), in accordance with some embodiments. The method 800 may comport with actions described in connection with FIGS. 1-7 in some embodiments.

At 802, the method 800 includes providing a bridge substrate composed of glass, ceramic, or a semiconductor material. At 804, the method 800 may further include forming electrical routing features through the bridge substrate and on the bridge substrate, the electrical routing features including through-hole vias, traces and pads. At 806, the method 800 may further include forming a sacrificial layer on a surface of the bridge substrate. At 808, the method 800 may further include forming openings in the sacrificial layer to expose one or more of the pads.

At 810, the method 800 may further include forming interconnect structures on the pads. At 812, the method 800 may further include forming an electrically conductive layer on the sacrificial layer, the electrically conductive layer being coupled with the interconnect structures. At 814, the method 800 may further include forming a strengthening layer on the electrically conductive layer. At 816, the method 800 may further include removing material of the sacrificial layer to provide an air gap between the bridge substrate and the electrically conductive layer. At 818, the method 800 may further include embedding the bridge substrate into a cavity formed in a package substrate using an adhesive. At 820, the method 800 may further include depositing a finishing film on the strengthening layer.

Figure 9:
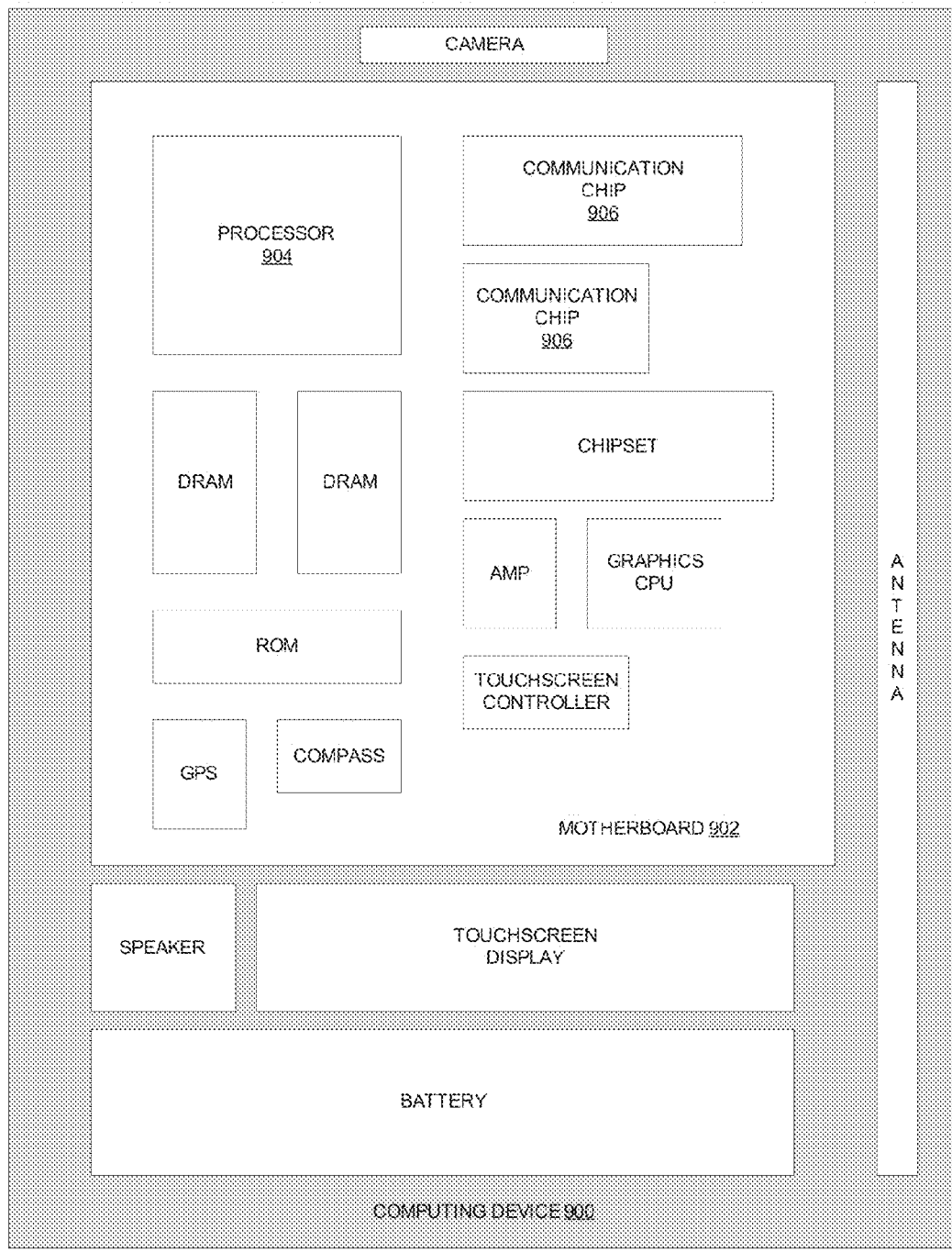
FIG. 9 schematically illustrates a computing device in accordance with one implementation of the invention.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 9 schematically illustrates a computing device 900 in accordance with one implementation of the invention. The computing device 900 may house a board such as motherboard 902. The motherboard 902 may include a number of components, including but not limited to a processor 904 and at least one communication chip 906. The processor 904 may be physically and electrically coupled to the motherboard 902. In some implementations, the at least one communication chip 906 may also be physically and electrically coupled to the motherboard 902. In further implementations, the communication chip 906 may be part of the processor 904.

Depending on its applications, computing device 900 may include other components that may or may not be physically and electrically coupled to the motherboard 902. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 906 may operate in accordance with other wireless protocols in other embodiments.

The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 may include a die (e.g., dies 102 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 906 may also include a die (e.g., dies 102 of FIG. 1) in an IC package assembly (e.g., IC package assembly 100 of FIG. 1) as described herein. In further implementations, another component (e.g., memory device or other integrated circuit device) housed within the computing device 900 may contain a die (e.g., dies 102 of FIG. 1) in an IC package assembly (e.g., IC package assembly 100 of FIG. 1) as described herein. Such dies may be configured to send or receive signals through a bridge as described herein.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method, comprising:
    forming a sacrificial layer on a surface of a bridge substrate comprising a glass, ceramic, or a semiconductor material, and prior to forming the sacrificial layer, forming electrical routing features through the bridge substrate and on the surface of the bridge substrate, the electrical routing features including through-hole vias, traces, and pads;
    forming an electrically conductive layer on the sacrificial layer, the electrically conductive layer being coupled with the surface of the bridge substrate through the sacrificial layer by an electrically conductive material; and
    removing material of the sacrificial layer to provide an air gap between the surface of the bridge substrate and the electrically conductive layer.

2. The method of claim 1, wherein forming the sacrificial layer comprises depositing silicon oxide (SiO$_2$).

3. The method of claim 1, further comprising:
    prior to forming the electrically conductive layer, forming openings in the sacrificial layer to expose one or more of the electrical routing features; and
    forming interconnect structures on the one or more exposed electrical routing features.

4. The method of claim 3, wherein forming the electrically conductive layer comprises forming a ground plane by depositing a metal on the sacrificial layer and the interconnect structures, the metal of the electrically conductive layer being coupled with the surface of the bridge substrate through the sacrificial layer by the interconnect structures.

5. The method of claim 1, further comprising:
    prior to removing material of the sacrificial layer, forming a strengthening layer on the electrically conductive layer to provide structural rigidity to the electrically conductive layer.

6. The method of claim 5, wherein forming the strengthening layer comprises depositing a metal or solder.

7. The method of claim 1, wherein removing material of the sacrificial layer comprises using an etch process comprising hydrofluoric (HF) acid to selectively remove material of the sacrificial layer and provide the air gap.

8. The method of claim 1, further comprising:
    embedding the bridge substrate into a cavity formed in a package substrate using an adhesive.

9. The method of claim 8, further comprising:
    depositing an epoxy film on the electrically conductive layer.

10. The method of claim 8, further comprising:
    attaching a first die and a second die to the package substrate, wherein the bridge substrate is configured to route electrical signals between the first die and the second die.

11. A method, comprising:
    forming a sacrificial layer directly on a surface of a bridge substrate comprising a glass, ceramic, or a semiconductor material;
    forming an electrically conductive layer on the sacrificial layer, the electrically conductive layer being coupled with the surface of the bridge substrate through the sacrificial layer by an electrically conductive material, and prior to forming the electrically conductive layer, forming openings in the sacrificial layer to expose one or more of the electrical routing features and forming interconnect structures on the one or more exposed electrical routing features; and
    removing material of the sacrificial layer to provide an air gap between the surface of the bridge substrate and the electrically conductive layer.

12. The method of claim 11, further comprising:
    prior to forming the sacrificial layer, forming electrical routing features through the bridge substrate and on the surface of the bridge substrate, the electrical routing features including through-hole vias, traces, and pads.

13. The method of claim 11, wherein forming the sacrificial layer comprises depositing silicon oxide (SiO$_2$).

14. The method of claim 11, further comprising:
    prior to removing material of the sacrificial layer, forming a strengthening layer on the electrically conductive layer to provide structural rigidity to the electrically conductive layer.

15. The method of claim 11, wherein removing material of the sacrificial layer comprises using an etch process comprising hydrofluoric (HF) acid to selectively remove material of the sacrificial layer and provide the air gap.

16. The method of claim 11, further comprising:
    embedding the bridge substrate into a cavity formed in a package substrate using an adhesive.

17. A method, comprising:
    forming a sacrificial layer on a surface of a bridge substrate comprising a glass, ceramic, or a semiconductor material;
    forming an electrically conductive layer on the sacrificial layer, the electrically conductive layer being coupled with the surface of the bridge substrate through the sacrificial layer by an electrically conductive material;

removing material of the sacrificial layer to provide an air gap between the surface of the bridge substrate and the electrically conductive layer; and embedding the bridge substrate into a cavity formed in a package substrate using an adhesive.

18. The method of claim 17, further comprising:

prior to forming the sacrificial layer, forming electrical routing features through the bridge substrate and on the surface of the bridge substrate, the electrical routing features including through-hole vias, traces, and pads.

19. The method of claim 17, wherein forming the sacrificial layer comprises depositing silicon oxide ($SiO_2$).

20. The method of claim 17, further comprising:

prior to removing material of the sacrificial layer, forming a strengthening layer on the electrically conductive layer to provide structural rigidity to the electrically conductive layer.

21. The method of claim 17, wherein removing material of the sacrificial layer comprises using an etch process comprising hydrofluoric (HF) acid to selectively remove material of the sacrificial layer and provide the air gap.

* * * * *